(12) United States Patent
Iwasawa

(10) Patent No.: US 7,034,543 B2
(45) Date of Patent: Apr. 25, 2006

(54) METHOD OF PREDICTING A LIFETIME OF FILAMENT IN ION SOURCE AND ION SOURCE DEVICE

(75) Inventor: Koji Iwasawa, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 54 days.

(21) Appl. No.: 10/712,344

(22) Filed: Nov. 14, 2003

(65) Prior Publication Data

US 2004/0149927 A1    Aug. 5, 2004

(30) Foreign Application Priority Data

Nov. 14, 2002   (JP)   ............................ P2002-330634

(51) Int. Cl.
G01R 31/08   (2006.01)
(52) U.S. Cl. ...................................... 324/525; 324/537
(58) Field of Classification Search ................ 324/713, 324/537; 250/423–427
See application file for complete search history.

(56) References Cited

U.S. PATENT DOCUMENTS

| | | | |
|---|---|---|---|
| 5,057,814 A | | 10/1991 | Onan et al. |
| 5,306,921 A | * | 4/1994 | Tanaka et al. .......... 250/423 R |
| 5,438,238 A | * | 8/1995 | Toy et al. ..................... 315/94 |
| 5,578,998 A | | 11/1996 | Kasprowicz |
| 5,943,594 A | * | 8/1999 | Bailey et al. ................ 438/514 |
| 6,646,268 B1 | * | 11/2003 | Murakoshi et al. .......... 250/427 |
| 6,797,964 B1 | | 9/2004 | Yamashita |
| 2004/0012498 A1 | * | 1/2004 | Peck et al. ................... 340/640 |

FOREIGN PATENT DOCUMENTS

| | | |
|---|---|---|
| JP | 1012450 | 1/1989 |
| JP | 04-306544 | 10/1992 |
| JP | 8227677 | 9/1996 |
| JP | 09-274866 | 10/1997 |
| TW | 486713 | 5/2002 |

OTHER PUBLICATIONS

European Search Report for Application No. GB 0326531.1 dated Mar. 11, 2004.
Taiwanese Office Action dated Apr. 28, 2005.

* cited by examiner

*Primary Examiner*—Anjan Deb
*Assistant Examiner*—Timothy J. Dole
(74) *Attorney, Agent, or Firm*—Finnegan, Henderson, Farabow, Garrett & Dunner, L.L.P.

(57) ABSTRACT

An ion source device includes an ion source having a filament for emitting thermoelectrons, a current measuring device for measuring current flowing through the filament, a voltage measuring device for measuring voltage across the filament, a resistance operation device for computing a resistance value of the filament by using the current and the voltage measured by the current and voltage measuring devices, and a prediction operation device for computing a time till the application limits of the filament or a time left till the application limits of the filament.

6 Claims, 2 Drawing Sheets

METHOD OF PREDICTING A LIFETIME OF FILAMENT IN ION SOURCE AND ION SOURCE DEVICE

BACKGROUND OF THE INVENTION

1. Field of the Invention

The present invention relates to a method for predicting a lifetime of a filament of anion source used in an ion implanter, and an ion source device having a device for predicting the lifetime of the filament.

2. Description of the Related Art

Hitherto, a lifetime of a filament for emitting thermoelectrons, which forms an ion source used by an ion implanter or the like is predicted in a manner that current (filament current) flowing through the filament is constantly measured during the operation of the ion source, the measured current values are each compared with a predetermined reference value, and a time left till the filament will be broken is estimated. The predetermined reference value is the past data on the filament current of the ion source using a filament having the same characteristics as those of the filament under measurement. A technique similar to the above one is described also in JP-A-04-306544 (paragraph Nos. [0017] and [0022], FIG. 1) given below.

The reason why the above-mentioned method has been used follows. To operate the ion source at a fixed output level (The output level corresponds to an ion beam current derived from the ion source in this specification), it is necessary to set the amount of thermoelectrons emitted from the filament at a fixed value. The amount of thermoelectrons is observed in the form of an arc current flowing between the filament and a plasma production chamber. To keep the arc current constant, in this type of ion source, usually, the amount of electric power fed to the filament is controlled to be constant by controlling the filament current.

In this case, as the operation of the ion source progresses, the filament becomes thin by the sputtering by ions in the plasma generated in the plasma production chamber and its evaporation. For example, the filament is gradually reduced in diameter at the center portion thereof. As a result, resistance of the overall filament increases, so that the filament current required for keeping the electric power fed to the filament at the fixed value, becomes smaller.

Accordingly, the related-art technique assumes that as the filament current becomes small, the diameter of the filament becomes small in diameter and hence, breaking of the filament more easily occurs. The filament current of the filament of the ion source under measurement is compared with a filament current at which the filament was broken in the reference ion source using the filament having the same characteristics as those of the filament under measurement. In this way, a time left till the filament will be broken is predicted.

The above-mentioned technical approach is correct, provided that the output level of the ion source is always constant. However, it is a rare case that an actual ion source used for the ion implanter or the like is operated in such a state, in other words, at the fixed output level.

In this connection, in the case of, for example, an ion source which is used for an ion implanter, called a medium-current ion implanter, an output of the ion source, i.e., an ion beam current derived from it, relatively widely varies from a maximum output level of 20 mA or higher to a minimum output level of about 0.1 mA.

The output of the ion source depends on the amount of thermoelectrons emitted from the filament. The filament current must be varied in accordance with an output required for the ion source. Accordingly, where the diameter of the filament is equal, when the output of the ion source is large, the filament current is large, and when it is small, the filament current is small. In other words, to decrease the output of the ion source, i.e., the ion beam current, it is necessary to decrease the arc current. To this end, it is necessary to reduce the filament current. In this case, its appears as if the lifetime of the filament is rapidly reduced in the case where the lifetime of the filament is predicted based on the measured filament current as in the related-art method. This is not correct because the filament current is merely reduced.

Thus, in the case where the output level of the ion source is not constant, the related-art technique for predicting the lifetime of the filament by measuring the filament current cannot predict the lifetime of the filament exactly.

SUMMARY OF THE INVENTION

It is, therefore, an object of the invention to provide a method for predicting a lifetime of a filament of an ion source, and an ion source device having a device for predicting the lifetime of the filament, capable of exactly predicting the lifetime of the filament of the ion source even when the output of the ion source is not constant.

According to a first aspect of the invention, there is a method of predicting a lifetime of a filament for emitting thermoelectrons in an ion source, the method comprising:

successively measuring a resistance value of the filament during an operation of the ion source on the basis of current flowing through the filament and voltage across the filament; and predicting the lifetime of the filament till the filament will be broken, on the basis of a rate of change of the resistance value.

The lifetime of the filament is determined by a diameter (or a cross sectional area) of the filament. A physical value directly relating to the determination of the filament lifetime is the resistance of the filament. This is because the resistance value $R$ [$\Omega$] of the filament is inversely proportional to a cross sectional area $A$ [m$^2$] as given by the following equation. In the equation, $\rho$ is a resistivity [$\Omega$m] of the filament, and $L$ is a length [m] of the filament. The resistance value $R$ remains unchanged even if the filament current is changed to change the output of the ion source.

$$R = \rho \cdot L / A \qquad \text{[Formula 1]}$$

In the invention, a resistance value of the filament during the operation of the ion source is successively measured on the basis of current flowing through the filament and voltage across the filament, and the lifetime of the filament till the filament will be broken is predicted on the basis of a rate of change of the resistance value. Therefore, the lifetime of the filament is exactly predicted even if the output of the ion source is not constant.

According to a second aspect of the invention, there is an ion source device comprising:

an ion source having a filament for emitting thermoelectrons;

a current measuring device for measuring current flowing through the filament;

a voltage measuring device for measuring voltage across the filament;

a resistance operation device for computing a resistance value of the filament by using the current and the voltage measured by the current and voltage measuring devices; and a prediction operation device for computing a time till an application limits of the filament or a time left till the application limits of the filament, on the basis of a rate of change of the resistance value computed by the resistance operation device.

The ion source device includes the resistance operation device, the prediction operation device, and others. Therefore, the ion source device can exactly predict the lifetime of the filament even if the output of the ion source is not constant, as in the predicting method of the first aspect.

DETAILED DESCRIPTION OF THE INVENTION

Figure 1:
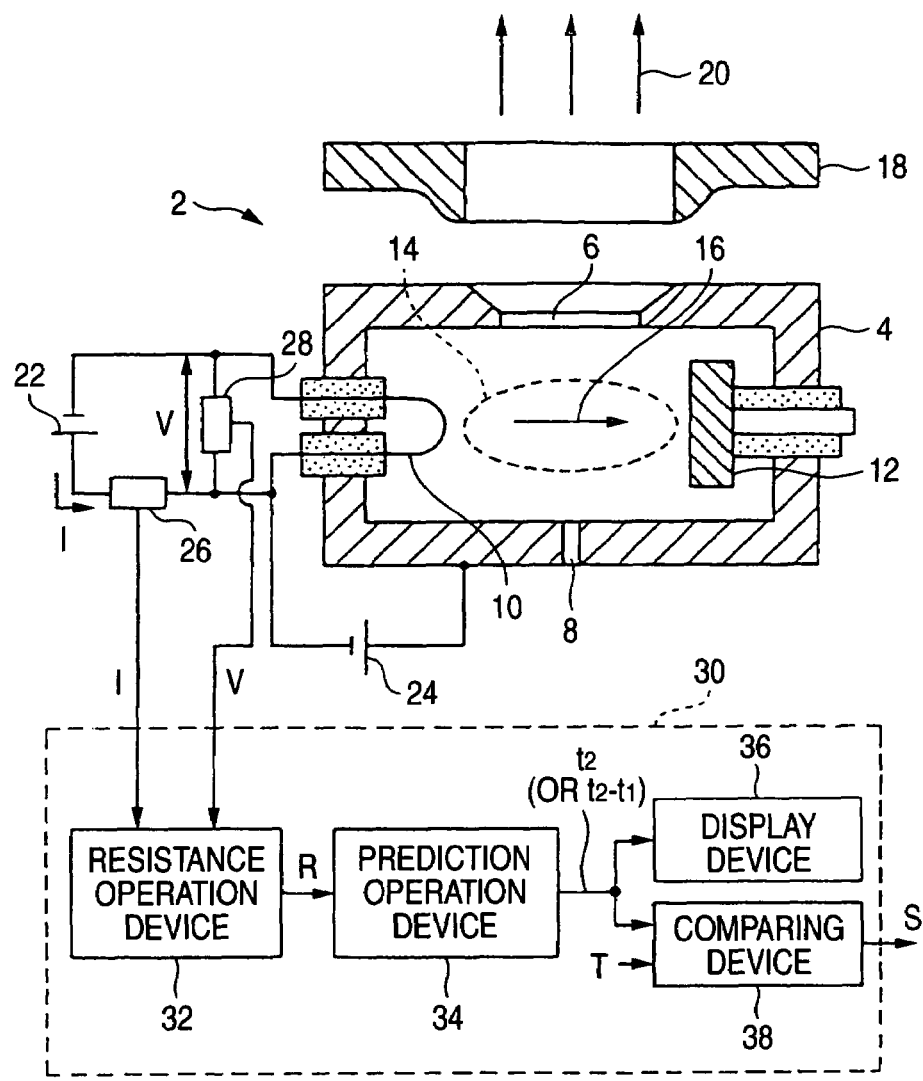
FIG. 1 is a diagram schematically showing an ion source device which executes a filament lifetime predicting method according to the invention.

FIG. 1 is a diagram schematically showing an ion source device which executes a filament lifetime predicting method according to the invention.

The ion source device comprises an ion source 2, a current measuring device 26, a voltage measuring device 28, and an operation control unit 30. The ion source 2 has a filament 10 for emitting thermoelectrons. The current measuring device 26 measures current I flowing through the filament 10. The voltage measuring device 28 measures voltage V across the filament 10. The operation control unit 30 predicts a lifetime of the filament 10 on the basis of the current I and the voltage V as measured.

The ion source 2 is called a Bernas-type ion source, and includes a plasma production chamber 4 serving also as an anode, a filament 10 shaped like U for emitting thermoelectrons, a reflector 12, and a slit-like ion extraction aperture 6.

The filament 10 is provided at one side in the interior of the plasma production chamber 4. The reflector 12 is provided at the other side in the interior of the plasma production chamber 4. The ion extraction aperture 6 is formed in a wall of the plasma production chamber 4. An extraction electrode system 18 for extracting an ion beam 20 from a plasma 14 generated in the plasma production chamber 4 is provided near an outlet of the ion extraction aperture 6. The extraction electrode system 18 is not limited to the one consisting of one sheet of electrode as illustrated.

A material gas, such as gas or vapor, from which the plasma 14, and thus the ion beam 20, is generated, is introduced into the plasma production chamber 4, through an introducing port 8. A magnetic flux 16 is applied into the plasma production chamber 4 along a line connecting the filament 10 and the reflector 12, by a magnetic flux generator (not shown). A filament power source 22 which feeds current to the filament 10 and heats the same is connected across the filament 10. An arc power source 24 is connected between one end of the filament 10 and the plasma production chamber 4, with a positive electrode of the arc power source 24 being connected to the latter.

In the ion source 2, in a state that the inside and the outside of the plasma production chamber 4 are evacuated, a material gas is introduced, at a proper flow rate, into the plasma production chamber 4. At the same time, the filament 10 is heated by the filament power source 22, and an arc voltage is applied to between the filament 10 and the plasma production chamber 4, from the arc power source 24. Thermoelectrons emitted from the filament 10 travel toward the plasma production chamber 4, while being accelerated under the arc voltage. The thermoelectrons collide with the material gas to ionize the material gas, to cause an arc discharge and finally to generate a plasma 14. An ion beam 20 is extracted from the plasma 14.

The current I flowing through the filament 10 is substantially equal to an output current of the filament power source 22, and can be measured by the current measuring device 26. The voltage V applied across the filament 10 is substantially equal to an output voltage of the filament power source 22, and can be measured by the voltage measuring device 28.

The operation control unit 30 includes a resistance operation device 32 and a prediction operation device 34. The resistance operation device 32 computes a resistance value R of the filament 10 by using the current I and the voltage V, which are measured. The prediction operation device 34 computes a time elapsed or left till an application limits of the filament 10 by using a rate of change of resistance value R (with respect to time).

To be more specific, a resistance value R [Ω] of the filament 10 is defined by the current I [A] and the voltage V [V], and computed by using a equation given below. An arithmetic operation of the equation is executed by the resistance operation device 32. In this way, the resistance value R of the filament 10 in the operating ion source 2 is successively measured. In this specification, the word "successively" involves the word "continuously". Generally, it means "constantly", and also means "intermittently", or "at predetermined time intervals" at which the resistance measurement is repeated.

$$R = V/I \quad \text{[Formula 2]}$$

Figure 2:
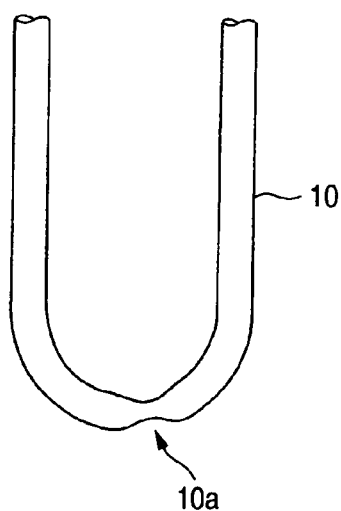
FIG. 2 is a diagram showing an example of a filament shown in FIG. 1 when a center portion of the filament is reduced in diameter.
Figure 3:
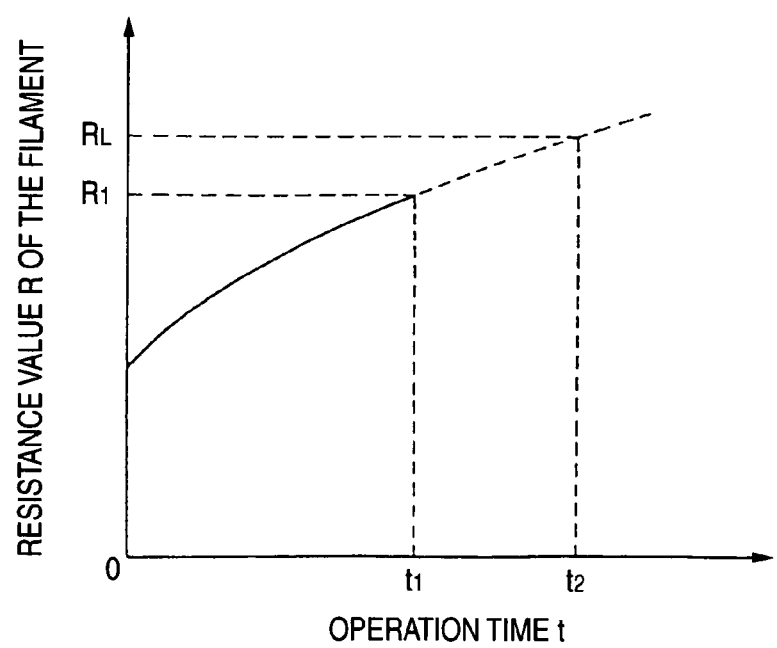
FIG. 3 is a graph showing a variation of the resistance value of the filament with respect to operation time of the ion source.

As the operation of the ion source 2 progresses, the filament 10 becomes thin by the sputtering by ions in the plasma 14 and its evaporation. For example, as shown in FIG. 2, the filament 10 progressively reduces its diameter at a center portion 10a thereof (in this example, a part of the top end of the filament). Accordingly, the resistance value R of the whole filament 10 becomes large as the filament 10 becomes thin. A variation of the resistance value with time is exemplarily graphed in FIG. 3. In the graph, the resistance value variation is indicated by a solid line.

It is assumed that where the ion source is operating, the present time point is t1, and a critical resistance value at which the filament 10 comes to its application limits is $R_L$. The critical resistance value $R_L$ can be obtained from past experience of a filament having the same characteristics (i.e., material, size, shape, etc.) as those of a filament currently used. In other words, a resistance value R exhibited by the filament when the filament is broken or when a probability that the filament will be broken is high is defined as the critical resistance value $R_L$.

A resistance value R of the filament 10 during the operation of the ion source is successively measured as described above. Then, a rate of change of the resistance value R1 at the present time point t1, i.e., dR1/dt1, is computed. A time point t2 at which the resistance value R of the filament 10 reaches the critical resistance value $R_L$ is computed by extrapolating a change of the resistance value R of the filament 10 with respect to operation time t of the ion source 2 by using the change rate dR1/dt1. Exactly, an arithmetic operation of Formula 3 is performed. Alternatively, a time t2−t1 left till the resistance value R of the filament 10 reaches the critical resistance value $R_L$ is computed. Exactly, an arithmetic operation of Formula 4 is performed. Formula 3 and 4 are mathematically equivalent to each other, and substantially equal to each other. Those operations are executed by the prediction operation device 34.

$$t2=(R_L-R_1)/(dR1/dt1)+t1 \qquad \text{[Formula 3]}$$

$$t2-t1=(R_L-R_1)/(dR1/dt1) \qquad \text{[Formula 4]}$$

In this way, the time t2 till the application limits of the filament 10 or the time t2−t1 left till the application limits of the filament is computed. Accordingly, a lifetime of the filament 10 till it will be broken is predicted.

The resistance value R of the filament 10 as an object to be measured remains unchanged even if the amount of the current I flowing into the filament 10 is changed to change the output of the ion source 2. The same thing is true for a case where the amount of the voltage V applied to the filament 10 is changed. The resistance value R of the filament 10 remains unchanged even for the change of the amount of the voltage V. Thus, in the invention, the resistance value R of the filament, which remains unchanged even if the filament current is changed to change the output of the ion source is used as an object to be measured, and a lifetime of the filament is predicted based on the result of the measurement. Accordingly, even if the output of the ion source 2 is not constant, the lifetime of the filament 10 can be predicted exactly.

As in the embodiment, a display device 36 may be provided which displays the time t2 or the remaining time t2−t1.

Further, a comparing device 38 may also be provided as in the embodiment. The comparing device compares the remaining time t2−t1 with a predetermined reference value T, and when the remaining time t2−t1 is smaller than the reference value T, it produces an alarm signal S.

The operation control unit 30 containing the resistance operation device 32, the operation control unit 30 and others may be constructed by using a computer, for example.

The present invention may be applied not only to the Bernus-type ion source, but also to other types of ion sources each using a filament for emitting thermoelectrons. An example of such is a Freeman-type ion source having a linear filament.

As seen from the foregoing description, the resistance value of the filament, which remains unchanged even if the filament current is changed to change the output of the ion source is used as an object to be measured, and a lifetime of the filament is predicted based on the result of the measurement. Accordingly, even if the output of the ion source 2 is not constant, the lifetime of the filament 10 can be predicted exactly.

The invention claimed is:

1. A method of predicting a lifetime of a filament for emitting thermoelectrons in an ion source, the method comprising:
   successively measuring a resistance value of the filament during an operation of the ion source on the basis of current flowing through the filament and voltage across the filament; and
   predicting the time until the filament will be broken, on the basis of a rate of change of the resistance value.

2. A method of predicting a lifetime of a filament according to claim 1, further comprising:
   computing a time till an application limits of the filament or a time left till the application limits of the filament, on the basis of a rate of change of the resistance value.

3. An ion source device comprising:
   an ion source having a filament for emitting thermoelectrons;
   a current measuring device for measuring current flowing through the filament;
   a voltage measuring device for measuring voltage across the filament;
   a resistance operation device for computing a resistance value of the filament by using the current and the voltage measured by the current and voltage measuring devices; and
   a prediction operation device for computing a time at which an application limits of the filament will be reached or a time left till the application limits of the filament is reached, on the basis of a rate of change of the resistance value computed by the resistance operation device.

4. An ion source device according to claim 3, further comprising:
   a display device for displaying the time at which the application limit of the filament or the time left till the application limits of the filament will be reached.

5. An ion source device according to claim 3, further comprising:
   a comparing device for comparing the time left till the application limit of the filament will be reached with a predetermined reference value, and producing an alarm signal when the time left till the application limits of the filament is reached is smaller than the predetermined reference value.

6. An ion source device comprising:
   an ion source having a filament for emitting thermoelectrons;
   a current measuring device for measuring current flowing through the filament;
   a voltage measuring device for measuring voltage across the filament;
   a resistance operation device for computing a resistance value of the filament by using the current and the voltage measured by the current and voltage measuring devices;
   a prediction operation device for computing a time at which an application limit of the filament will be reached or a time left until the application limit of the filament is reached, on the basis of a rate of change of the resistance value computed by the resistance operation device; and
   a display device for displaying the time at which the application limit of the filament is reached or the time left until the application limit of the filament is reached.

* * * * *

UNITED STATES PATENT AND TRADEMARK OFFICE
CERTIFICATE OF CORRECTION

PATENT NO. : 7,034,543 B2
APPLICATION NO. : 10/712344
DATED : April 25, 2006
INVENTOR(S) : Koji Iwasawa Page 1 of 1

It is certified that error appears in the above-identified patent and that said Letters Patent is hereby corrected as shown below:

Col. 6, line 36, "limits" should read --limit--.

Signed and Sealed this

Twenty-first Day of November, 2006

JON W. DUDAS
*Director of the United States Patent and Trademark Office*